United States Patent [19]

Bégin et al.

[11] Patent Number: 5,682,395
[45] Date of Patent: Oct. 28, 1997

[54] METHOD AND APPARATUS FOR CORRECTING AND DECODING A SEQUENCE OF BRANCHES REPRESENTING ENCODED DATA BITS INTO ESTIMATED INFORMATION BITS

[75] Inventors: Guy Bégin, Verdun; Claude Thibeault, St-Léonard, both of Canada

[73] Assignee: Université du Québec à Montréal, Montréal, Canada

[21] Appl. No.: 425,030

[22] Filed: Apr. 19, 1995

[51] Int. Cl.⁶ .................................................. G06F 11/10
[52] U.S. Cl. ............................................................ 371/43
[58] Field of Search .......................... 371/43–46; 341/51, 341/94

[56] References Cited

U.S. PATENT DOCUMENTS

| | | | |
|---|---|---|---|
| 4,493,082 | 1/1985 | Cumberton et al. | 371/43 |
| 4,545,054 | 10/1985 | Davis | 371/43 |
| 4,614,933 | 9/1986 | Yamashita et al. | 341/51 |
| 4,809,277 | 2/1989 | Yano | 371/43 |
| 4,888,775 | 12/1989 | Karabed et al. | 371/43 |
| 4,888,779 | 12/1989 | Karabed et al. | 371/43 |
| 4,922,507 | 5/1990 | Simon et al. | 371/43 |
| 4,945,549 | 7/1990 | Simon et al. | 371/43 |
| 4,998,253 | 3/1991 | Ohashi et al. | 371/43 |
| 5,014,276 | 5/1991 | Bush et al. | 371/43 |
| 5,077,743 | 12/1991 | Bitzer et al. | 371/43 |

FOREIGN PATENT DOCUMENTS

| | | |
|---|---|---|
| 0383632 | 8/1990 | European Pat. Off. . |
| 9107035 | 5/1991 | WIPO . |

OTHER PUBLICATIONS

Mise en application basée sur microprocesseur et essai d'un détecteur Viterbi simple—Crozier et al. —1981 Can. Elec. Eng. J. vol. 6 No. 3, pp. 3–8.

Primary Examiner—Reba I. Elmore
Assistant Examiner—Steven R. Garland
Attorney, Agent, or Firm—Lowe, Price, LeBlanc & Becker

[57] ABSTRACT

The method is for correcting and decoding a sequence of branches representing encoded data bits into estimated information bits. The encoded data bits were previously encoded in a convolutional manner with v encoded symbols forming a branch where v is a predetermined value. The method comprising the steps of (a) setting accumulation, correction and event indicators respectively into non-accumulating, non-active and incomplete states, and setting a precedent Nccb variable at a predetermined value N; (b) receiving the sequence of branches, for each of the branches received in the step (b) a series of verification and calculation being performed; and (c) verifying whether the branch corresponding to the oldest undelivered estimated information bit has gone through all the substeps of step (b), and if it is the case, delivering the oldest undelivered estimated information bit when the oldest undelivered estimated information bit is no longer convolutionally associated with any of the branches corresponding to the syndromes stored in the first and second registers. An apparatus for performing the method is also described.

12 Claims, 12 Drawing Sheets

| ERROR PATTERN | | | | | | | | | | | | SYNDROME BITS | | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 1 | 0 | 0 | 0 | 1 | 0 | 1 |
| 0 | 0 | 0 | 0 | 0 | 0 | 0 | 0 | 0 | 0 | 1 | 0 | 0 | 0 | 0 | 1 | 1 | 1 |
| 0 | 0 | 0 | 0 | 0 | 0 | 0 | 0 | 0 | 1 | 0 | 0 | 0 | 0 | 1 | 0 | 1 | 0 |
| 0 | 0 | 0 | 0 | 0 | 0 | 0 | 0 | 1 | 0 | 0 | 0 | 0 | 0 | 1 | 1 | 1 | 0 |
| 0 | 0 | 0 | 0 | 0 | 0 | 0 | 1 | 0 | 0 | 0 | 0 | 0 | 1 | 0 | 1 | 0 | 0 |
| 0 | 0 | 0 | 0 | 0 | 0 | 1 | 0 | 0 | 0 | 0 | 0 | 0 | 1 | 1 | 1 | 0 | 0 |
| 0 | 0 | 0 | 0 | 0 | 1 | 0 | 0 | 0 | 0 | 0 | 0 | 1 | 0 | 1 | 0 | 0 | 0 |
| 0 | 0 | 0 | 0 | 1 | 0 | 0 | 0 | 0 | 0 | 0 | 0 | 1 | 1 | 1 | 0 | 0 | 0 |
| 0 | 0 | 0 | 1 | 0 | 0 | 0 | 0 | 0 | 0 | 0 | 0 | 0 | 1 | 0 | 0 | 0 | 0 |
| 0 | 0 | 1 | 0 | 0 | 0 | 0 | 0 | 0 | 0 | 0 | 0 | 1 | 1 | 0 | 0 | 0 | 0 |
| 0 | 1 | 0 | 0 | 0 | 0 | 0 | 0 | 0 | 0 | 0 | 0 | 1 | 0 | 0 | 0 | 0 | 0 |
| 1 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 1 | 1 | 0 | 0 | 0 | 0 | 1 | 0 |
| 0 | 0 | 0 | 0 | 0 | 0 | 0 | 0 | 0 | 1 | 0 | 1 | 0 | 0 | 1 | 1 | 1 | 1 |
| 0 | 0 | 0 | 0 | 0 | 0 | 0 | 0 | 1 | 0 | 0 | 1 | 0 | 0 | 1 | 0 | 1 | 1 |
| 0 | 0 | 0 | 0 | 0 | 0 | 0 | 1 | 0 | 0 | 0 | 1 | 0 | 1 | 0 | 0 | 0 | 1 |
| 0 | 0 | 0 | 0 | 0 | 0 | 1 | 0 | 0 | 0 | 0 | 1 | 0 | 1 | 1 | 0 | 0 | 1 |
| 0 | 0 | 0 | 0 | 0 | 1 | 0 | 0 | 0 | 0 | 0 | 1 | 1 | 0 | 1 | 1 | 0 | 1 |
| 0 | 0 | 0 | 0 | 1 | 0 | 0 | 0 | 0 | 0 | 1 | 1 | 1 | 1 | 1 | 1 | 0 | 1 |
| 0 | 0 | 0 | 1 | 0 | 0 | 0 | 0 | 0 | 0 | 1 | 1 | 0 | 1 | 0 | 1 | 0 | 1 |
| 0 | 0 | 1 | 0 | 0 | 0 | 0 | 0 | 0 | 0 | 0 | 1 | 1 | 1 | 0 | 1 | 0 | 1 |
| 0 | 1 | 0 | 0 | 0 | 0 | 0 | 0 | 0 | 0 | 0 | 1 | 1 | 0 | 0 | 1 | 0 | 1 |
| 1 | 0 | 0 | 0 | 0 | 0 | 0 | 0 | 0 | 0 | 0 | 1 | 1 | 0 | 0 | 1 | 0 | 1 |

Figure 6A

| ERROR PATTERN | | | | | | | | | | | SYNDROME BITS | | | | | |
|---|---|---|---|---|---|---|---|---|---|---|---|---|---|---|---|---|
| 0 | 0 | 0 | 0 | 0 | 0 | 0 | 0 | 0 | 1 | 1 | 0 | 0 | 0 | 0 | 1 | 0 |
| 0 | 0 | 1 | 0 | 0 | 0 | 0 | 1 | 0 | 1 | 0 | 0 | 0 | 0 | 0 | 1 | 0 |
| 0 | 0 | 0 | 1 | 0 | 1 | 0 | 0 | 1 | 0 | 0 | 0 | 0 | 0 | 0 | 1 | 0 |
| 1 | 0 | 0 | 0 | 1 | 0 | 0 | 0 | 1 | 0 | 0 | 0 | 0 | 0 | 0 | 1 | 0 |
| 0 | 0 | 0 | 0 | 0 | 0 | 1 | 1 | 1 | 0 | 0 | 0 | 0 | 0 | 0 | 1 | 0 |
| 0 | 1 | 0 | 0 | 1 | 0 | 0 | 0 | 1 | 0 | 0 | 0 | 0 | 0 | 0 | 1 | 0 |

Figure 6B

| ERROR PATTERN | | | | | | | | | | | SYNDROME BITS | | | | | |
|---|---|---|---|---|---|---|---|---|---|---|---|---|---|---|---|---|
| 0 | 1 | 0 | 0 | 0 | 1 | 0 | 0 | 0 | 1 | 0 | 0 | 1 | 1 | 1 | 0 | 1 |
| 0 | 0 | 1 | 0 | 0 | 0 | 0 | 0 | 1 | 0 | 0 | 1 | 0 | 1 | 1 | 1 | 0 | 1 |
| 1 | 0 | 0 | 0 | 0 | 1 | 0 | 0 | 0 | 1 | 0 | 0 | 1 | 1 | 1 | 0 | 1 |
| 0 | 0 | 0 | 0 | 0 | 0 | 1 | 0 | 0 | 1 | 0 | 1 | 0 | 1 | 1 | 1 | 0 | 1 |
| 0 | 0 | 0 | 1 | 1 | 0 | 0 | 0 | 0 | 1 | 0 | 0 | 1 | 1 | 1 | 0 | 1 |

Figure 6C

METHOD AND APPARATUS FOR CORRECTING AND DECODING A SEQUENCE OF BRANCHES REPRESENTING ENCODED DATA BITS INTO ESTIMATED INFORMATION BITS

FIELD OF THE INVENTION

The present invention is concerned with a method and an apparatus for correcting and decoding a sequence of branches representing encoded data bits into estimated information bits. The encoded data bits were previously encoded in a convolutional manner with v encoded symbols forming a branch where v is a predetermined value.

BACKGROUND OF THE INVENTION

It is well known in the art, that in order to protect data from transmission errors, an information stream is first run through an encoder that adds redundancy to the data before transmission on a noisy channel. This redundancy is exploited by a decoder at the receiving end to correct transmission errors. Whereas an encoder for a convolutional code is a simple machine that merely assigns a coded sequence to an information sequence according to a specified coding rule called a code, the decoder is a complex machine that must elaborate and evaluate hypotheses in order to select an estimated information sequence, called decoded information sequence, that minimizes the number of residual errors.

A decoding technique for analyzing convolutional codes has been proposed by Viterbi. This technique is also useful for actually decoding convolutionally encoded data. The Viterbi decoding method requires the continuous monitoring of the state of the encoder for every information sequence hypothesis envisioned. This requires keeping track of $2^{k-1}$ hypothetic information sequences for a convolutional code derived from a length K encoder. A trellis diagram is a convenient way to represent these hypotheses. Each path in the trellis corresponds to a possible information sequence with a corresponding encoded sequence, and the meeting points of the paths, called the nodes, correspond to the states of the encoder. The path sections between nodes are called branches of the trellis. Since a decoder based on the Viterbi algorithm must perform $2^{k-1}$ basic operations just to obtain and keep track of path hypotheses, its use is limited to the decoding of codes with short constraint length, which are less powerful than long constraint length codes.

Other decoding techniques for convolutional codes try to alleviate these difficulties. A number of decoding techniques, collectively known as sequential decoding methods, eliminate the exponential nature of the computational load by keeping track of a smaller number of path hypotheses. The price to pay for the reduction in computational effort is either a degradation of the error correction capability or a variability of the computational effort that leads to delicate interfacing with constant data rate transmission systems and to losses of data when the decoding requires too much effort.

Still another family of decoding techniques do not track the information hypotheses at all, relying instead on the use of syndromes to characterize transmission errors, and on the use of special classes of convolutional codes that allow the recovery of information bits from corrected received sequences. For binary convolutional codes, syndromes are binary sequences computed from the received sequence by a machine similar to a convolutional encoder, and that are used to distinguish between classes of configurations of transmission errors. In threshold decoding, systematic convolutional codes are used and syndromes are computed and used in real time for calculating correcting masks that indicate corrections to perform on received symbols or on estimated information bits. The principal drawback of these methods is that systematic convolutional codes are not as powerful as nonsystematic convolutional codes.

Since these decoding techniques do not track path hypotheses, they sometimes end up producing long series of incorrect decoded bits because the path hypothesis that is implicitly followed is not the correct path and stays apart from it. This behavior, called error propagation, leads to a degradation of decoder performance and must be controlled, either by inhibiting actual decoding operations until enough error free symbols are received so that the decoder may synchronize again on the correct path, or through the use of special convolutional codes that exhibit auto-synchronizing properties. Both approaches may be used together to control error propagation, but even then, performance is degraded because of undecoded segments or of the fact that auto-synchronizing convolutional codes are not among the more powerful codes.

Known in the art, there is the U.S. Pat. No. 5,077,743 granted on Dec. 31, 1991, in which there is described a system and a method for decoding of convolutionally encoded data. The method comprises the steps of producing Exclusive-OR bit groups from a succession of 2L lengths of parity bits; employing non-zero Exclusive-OR bit groups to determine probable parity bit corrections; and correcting said encoded parity bit stream in accordance with said probable parity bit corrections. In the above described method, there is a correcting step for each succession of 2L lengths of parity bits. As the correcting step takes a certain time, this method is relatively slow.

Also known in the art, there are the following documents:

U.S. Pat. Nos.:
4,493,082
4,545,054
4,614,933
4,809,277
4,888,775
4,888,779
4,922,507
4,945,549

International Application No.:
WO 91/07035

European Application No.:
0,383,632

Publication:
"Mise en application basée sur microprocesseur et essai c'un détecteur Viterbi simple"—(Crozier et coll.)—1981

OBJECT OF THE PRESENT INVENTION

An object of the present invention is to provide a method and an apparatus for correcting and decoding a sequence of branches representing encoded data bits into estimated information bits which is faster, which tracks path hypotheses and significantly reduces error propagation than similar method and apparatus of the prior art.

SUMMARY OF THE INVENTION

According to the present invention, there is provided a method for correcting and decoding a sequence of branches representing encoded data bits into estimated information bits, the encoded data bits having been previously encoded in a convolutional manner with v encoded symbols forming a branch where v is a predetermined value, the method comprising the steps of:

a) setting accumulation, correction and event indicators respectively into non-accumulating, non-active and incomplete states, and setting a precedent Nccb variable at a predetermined value N;

b) receiving the sequence of branches, for each of the branches received in the step (b):

i) calculating (v−1) syndromes corresponding to the branch;

ii) calculating an estimated information bit, storing the estimated information bit and calculating an actual Nccb variable based on the (v−1) syndromes and on the precedent Nccb variable;

iii) verifying whether values of the precedent and actual Nccb variables are non-successive and whether the precedent Nccb variable is greater than or equal to N, and, if both conditions are positive, setting the accumulation indicator into an accumulating state and setting an Nss variable at zero;

iv) verifying whether the accumulation indicator is in the accumulating state and whether the event indicator is in the incomplete state, and, if both conditions are positive, accumulating the (v−1) syndromes calculated in step (i) in a first register and incrementing the Nss variable by one;

v) verifying whether the correction indicator is in an active state and whether the event indicator is in the incomplete state, and, if both conditions are positive, storing the (v−1) syndromes calculated in step (i) in a second register having a given length;

vi) verifying whether the accumulation indicator is in the accumulating state, whether the precedent Nccb variable equals (N−1) and whether the actual Nccb variable equals N, and, if all conditions are positive:

setting the accumulation indicator into the non-accumulating state, the correction indicator into an active state and the event indicator into a complete state;

transferring all of the syndromes accumulated in the first register in the second register; and setting an Nmp variable at a value of the Nss variable;

vii) verifying whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second register;

viii) verifying whether the accumulation indicator is in the accumulating state, whether the event indicator is in the incomplete state and whether the first register is full, and, if all conditions are positive:

setting the accumulation indicator in the non-accumulating state and the correction indicator in the active state;

transferring all of the syndromes accumulated in the first register to the second register; and setting the Nmp variable at a value representing the length of the second register;

ix) verifying whether the correction indicator is in the active state, and if the correction indicator is in the active state:

correcting estimated information bits convolutionally associated with the branch corresponding to the syndromes stored in the second register;

updating the syndromes stored in the second register;

verifying whether the event indicator is in the complete state and decrementing the Nmp variable by one if the event indicator is in the complete state; and verifying whether the Nmp variable equals zero and setting the event indicator into the incomplete state and the correction indicator into the non-active state if the Nmp variable equals zero; and c) verifying whether the branch corresponding to the oldest undelivered estimated information bit has gone through steps (i) to (ix), and if the branch corresponding to the oldest undelivered estimated information bit has gone through steps (i) to (ix), delivering the oldest undelivered estimated information bit when said oldest undelivered estimated information bit is no longer convolutionally associated with any of the branches corresponding to the syndromes stored in the first and second registers.

According to the present invention, there is also provided an apparatus for correcting and decoding a sequence of branches representing encoded data bits into estimated information bits, the encoded data bits having been previously encoded in a convolutional manner, the apparatus comprising:

setting means for setting accumulation, correction and event indicators respectively into non-accumulating, non-active and incomplete states, and setting a precedent Nccb variable at a predetermined value N;

an input interface for receiving the sequence of branches;

first calculating means for calculating (v−1) syndromes for each branch;

second calculating means for calculating an estimated information bit for each branch;

storing means for storing the estimated information bit for each branch;

third calculating means for calculating for each branch an actual Nccb variable based on the (v−1) syndromes and on the precedent Nccb variable;

first verifying and setting means for verifying for each branch whether values of the precedent and actual Nccb variables are non-successive and whether the precedent Nccb variable is greater than or equal to N, and, if both conditions are positive, setting the accumulation indicator into an accumulating state and setting an Nss variable at zero;

verifying, accumulating and incrementing means for verifying for each branch whether the accumulation indicator is in the accumulating state and whether the event indicator is in the incomplete state, and, if both conditions are positive, accumulating the (v−1) syndromes calculated by the first calculating means in a first register and incrementing the Nss variable by one;

verifying and storing means for verifying for each branch whether the correction indicator is in an active state and whether the event indicator is in the incomplete state, and, if both conditions are positive, storing the (v−1) syndromes calculated by the first calculating means in a second register having a given length;

first verifying, setting and transferring means for verifying for each branch whether the accumulation indicator is in the accumulating state, whether the precedent Nccb variable equals (N−1) and whether the actual Nccb variable equals N, and, if all conditions are positive: setting the accumulation indicator into the non-accumulating state, the correction indicator into an active state and the event indicator into a complete state;

transferring all of the syndromes accumulated in the first register in the second register; and setting an Nmp variable at a value of the Nss variable;

second verifying and setting means for verifying for each branch whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second register;

second verifying, setting and transferring means for verifying for each branch whether the accumulation indicator is in the accumulating state, whether the event indicator is in the incomplete state and whether the first register is full, and, if all conditions are positive:

setting the accumulation indicator in the non-accumulating state and the correction indicator in the active state;

transferring all of the syndromes accumulated in the first register to the second register; and setting the Nmp variable at a value representing the length of the second register;

verifying, correcting, updating, decrementing and setting means for verifying for each branch whether the correction indicator is in the active state, and if the correction indicator is in the active state:

correcting the estimated information bits convolutionally associated with the branch corresponding to the syndromes stored in the second register;

updating the syndromes stored in the second register;

verifying whether the event indicator is in the complete state and decrementing the Nmp variable by one if the event indicator is in the complete state; and verifying whether the Nmp variable equals zero and setting the event indicator into the incomplete state and the correction indicator into the non-active state if the Nmp variable equals zero;

output interface for delivering an information bit; and verifying means for verifying whether the branch corresponding to the oldest undelivered estimated information bit has gone through all of the verifying means, and if the branch corresponding to the oldest undelivered estimated information bit has gone through all of the verifying means, delivering via the output interface the oldest undelivered estimated information bit when the oldest undelivered estimated information bit is no longer convolutionally associated with any of the branches corresponding to the syndromes stored in the first and second registers.

The objects, advantages and other features of the present invention will become more apparent upon reading of the following non restrictive description of preferred embodiments thereof, given for the purpose of exemplification only with reference to the accompanying drawings.

BRIEF DESCRIPTION OF THE DRAWINGS

In the attached drawings:

FIGS. 6A, 6B and 6C are tables showing various error patterns and corresponding syndrome bits.

DETAILED DESCRIPTION OF THE DRAWINGS

Figure 1A:
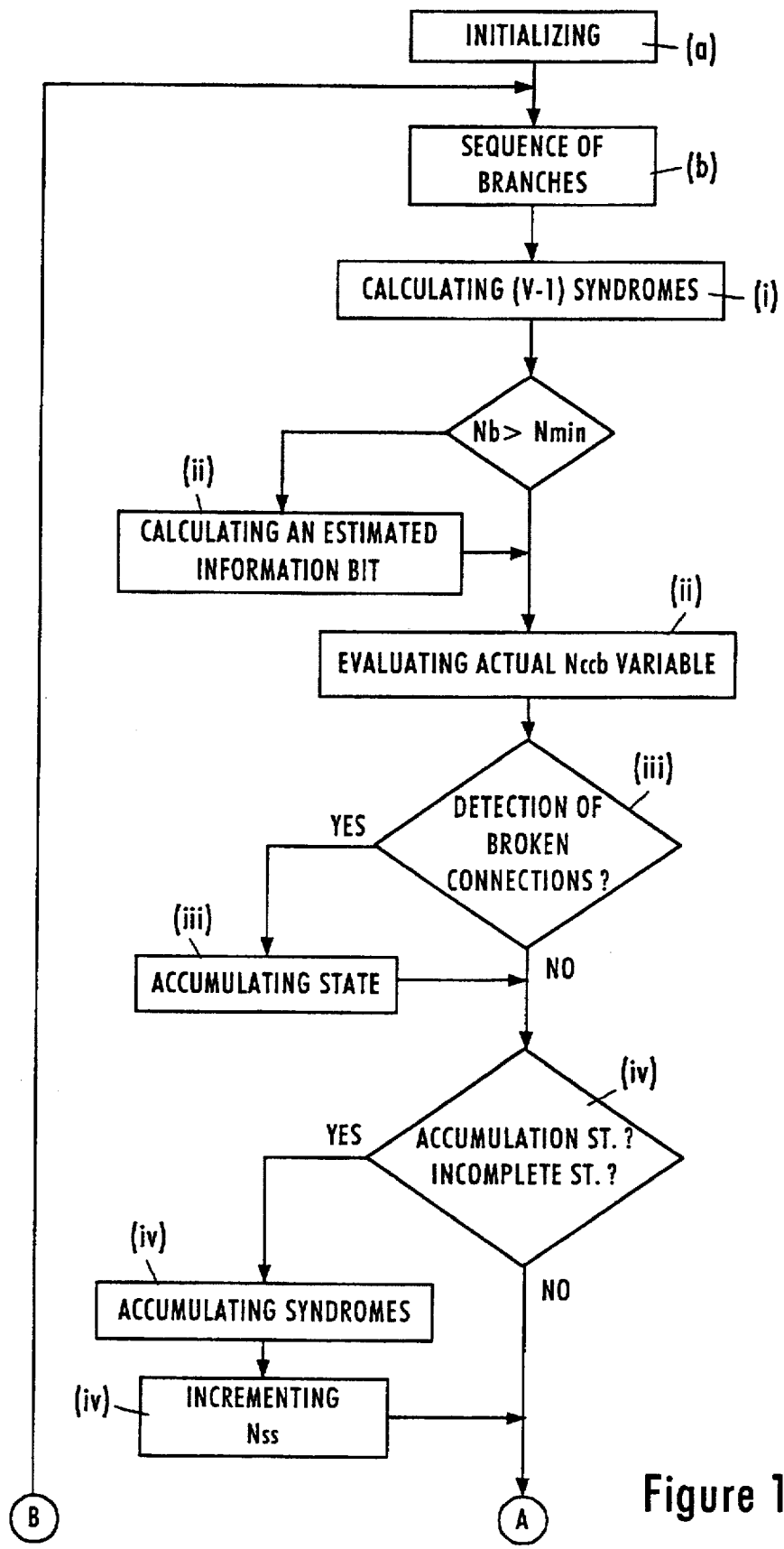
FIGS. 1A, 1B and 1C are flow chart diagrams showing the steps of a method according to a preferred embodiment of the present invention.
Figure 1B:
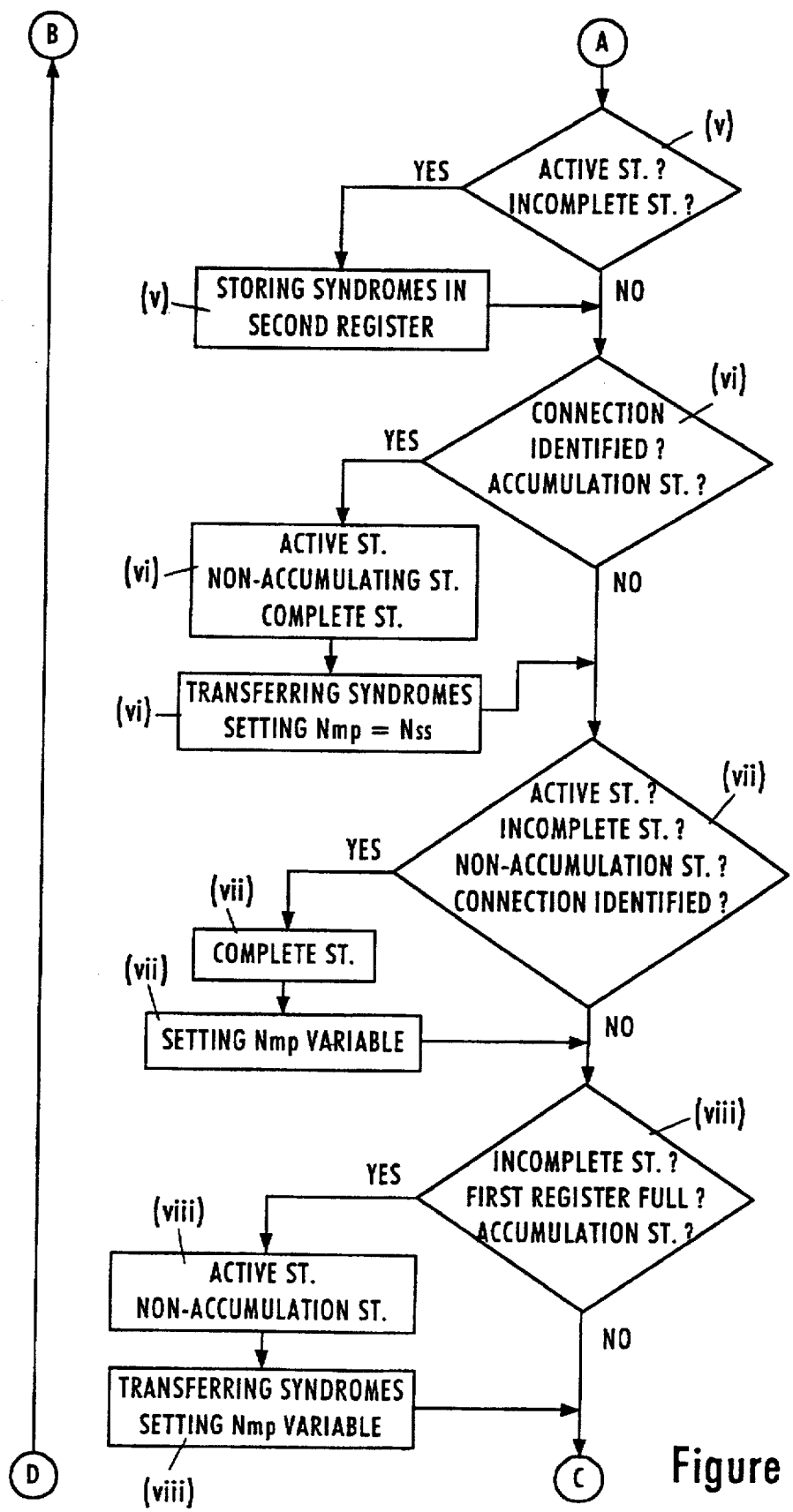

Referring now to FIGS. 1A and 1B, there is shown a method for correcting and decoding a sequence of branches representing encoded data bits into estimated information bits. The encoded data bits have been previously encoded in a convolutional manner with v encoded symbols forming a branch where v is a predetermined value.

The method comprises an initializing step which comprises a step of (a) setting accumulation, correction and event indicators respectively into non-accumulating, non-active and incomplete states, and setting a precedent Nccb variable at a predetermined value N.

The sequence of branches is received in a step (b). For each of the branches received in the step (b), the following steps (i) to (ix) are performed. The step (i) comprises a step of calculating (v−1) syndromes corresponding to the branch. The step (ii) comprises a step of calculating an estimated information bit, storing the estimated information bit and calculating an actual Nccb variable based on the (v−1) syndromes and on the precedent Nccb variable. More precisely, if all (v−1) syndromes equal 0, then the actual Nccb variable equals the precedent Nccb variable +1, or if any of the (v−1) syndromes is different from zero, then the actual Nccb variable equals 1. The step (ii) may further comprise, before the steps of calculating an estimated information bit and storing the estimated information bit of the step (ii), the step of verifying whether all the branches convolutionally associated with the estimated information bit to be calculated are received and, if all the branches convolutionally associated with the estimated information bit to be calculated are received, performing the steps of calculating an estimated information bit and storing the estimated information bit of the step (ii).

The step (iii) comprises a step of verifying whether values of the precedent and actual Nccb variables are non-successive and whether the precedent Nccb variable is greater than or equal to N, and, if both conditions are positive, setting the accumulation indicator into an accumulating state and setting an Nss variable at zero. These two conditions are called Detection of Broken Connections in the diagram.

The step (iv) comprises a step of verifying whether the accumulation indicator is in the accumulating state and whether the event indicator is in the incomplete state, and, if both conditions are positive, accumulating the (v−1) syndromes calculated in step (i) in a first register and incrementing the Nss variable by one. The step (v) comprises a step of verifying whether the correction indicator is in an active state and whether the event indicator is in the incomplete state, and, if both conditions are positive, storing the (v−1) syndromes calculated in step (i) in a second register having a given length. The step (vi) comprises a step of verifying whether the accumulation indicator is in the accumulating state, whether the precedent Nccb variable equals (N−1) and whether the actual Nccb variable equals N, and, if all conditions are positive:

- setting the accumulation indicator into the non-accumulating state, the correction indicator into an active state and the event indicator into a complete state;
- transferring all of the syndromes accumulated in the first register the second register; and
- setting an Nmp variable at a value of the Nss variable. The tests on the precedent and actual Nccb variables are called Connection Identified in the diagram.

The step (vii) comprises a step of verifying whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second register. The tests on the precedent and actual Nccb variables are called Connection Identified in the diagram. The step (viii) comprises a step of verifying whether the accumulation indicator is in the accumulating state, whether the event indicator is in the incomplete state and whether the first register is full, and, if all conditions are positive:

- setting the accumulation indicator in the non-accumulating state and the correction indicator in the active state;
- transferring all of the syndromes accumulated in the first register to the second register; and
- setting the Nmp variable at a value representing the length of the second register.

The step (ix) comprises a step of verifying whether the correction indicator is in the active state, and if the correction indicator is in the active state:

- correcting estimated information bits convolutionally associated with the branch corresponding to the syndromes stored in the second register;
- updating the syndromes stored in the second register;
- verifying whether the event indicator is in the complete state and decrementing the Nmp variable by one if the event indicator is in the complete state; and
- verifying whether the Nmp variable equals zero and setting the event indicator into the incomplete state and the correction indicator into the non-active state if the Nmp variable equals zero.

The method also comprises the step (c) which comprises a step of verifying whether the branch corresponding to the oldest undelivered estimated information bit has gone through steps (i) to (ix), and if the branch corresponding to the oldest undelivered estimated information bit has gone through steps (i) to (ix), delivering the oldest undelivered estimated information bit when the oldest undelivered estimated information bit is no longer convolutionally associated with any of the branches corresponding to the syndromes stored in the first and second registers, referred to in the Figure as the bit ready for delivery.

The above described method for correcting and decoding a sequence of branches into estimated information bits, is faster to similar methods of the prior art because, among other aspects, the correcting step is not performed for each branch but as it can be seen above, it is performed only when certain conditions are met.

Preferably, the step (a) further comprises the step of setting a variable Nb equal to 0. Preferably, the step (a) further comprises the step of providing a masking table. Also preferably, the step (t) further comprises the step of incrementing the variable Nb by 1.

Preferably, the step (ii) comprises, before the steps of calculating an estimated information bit and storing the estimated information bit of the step (ii), the step of verifying whether Nb is greater than a predetermined value Nmin and, if it is the case, then performing the steps of calculating an estimated information bit and storing the estimated information bit of the step (ii).

The encoded data bits were previously encoded in a convolutional manner with v encoded symbols forming a branch, v being a predetermined value, and with a constraint span K. Also preferably, in the step (ii), the predetermined value Nmin is equal to (K−2).

Preferably, the correcting of the step (ix) comprises the steps of:

- using the masking table to determine a mask corresponding to the syndromes stored in the second register;
- applying a correction factor to the estimated information bit convolutionally associated with all of the branches corresponding to the syndromes stored in the second register to perform a correction thereof, the correction factor being determined from the mask and from the convolutional manner; and
- applying an updating factor to the syndromes stored in the second register. The updating factor is determined from the mask and from the convolutional manner.

Preferably, in step (c), the oldest undelivered estimated bit is the estimated bit having a position corresponding to a value of (Nb−Dd). Dd has a value suitably selected to allow that the oldest undelivered estimated information bit be no longer convolutionally associated with any of the branches corresponding to the syndromes stored in the first and second registers. Preferably, according to an alternative, the step (c) further comprises the step of verifying whether the oldest undelivered estimated information bit is no longer convolutionally associated with any of the branches corresponding to the syndromes stored in the first and second registers. If it is the case, the oldest undelivered estimated information bit is delivered.

Figure 2:
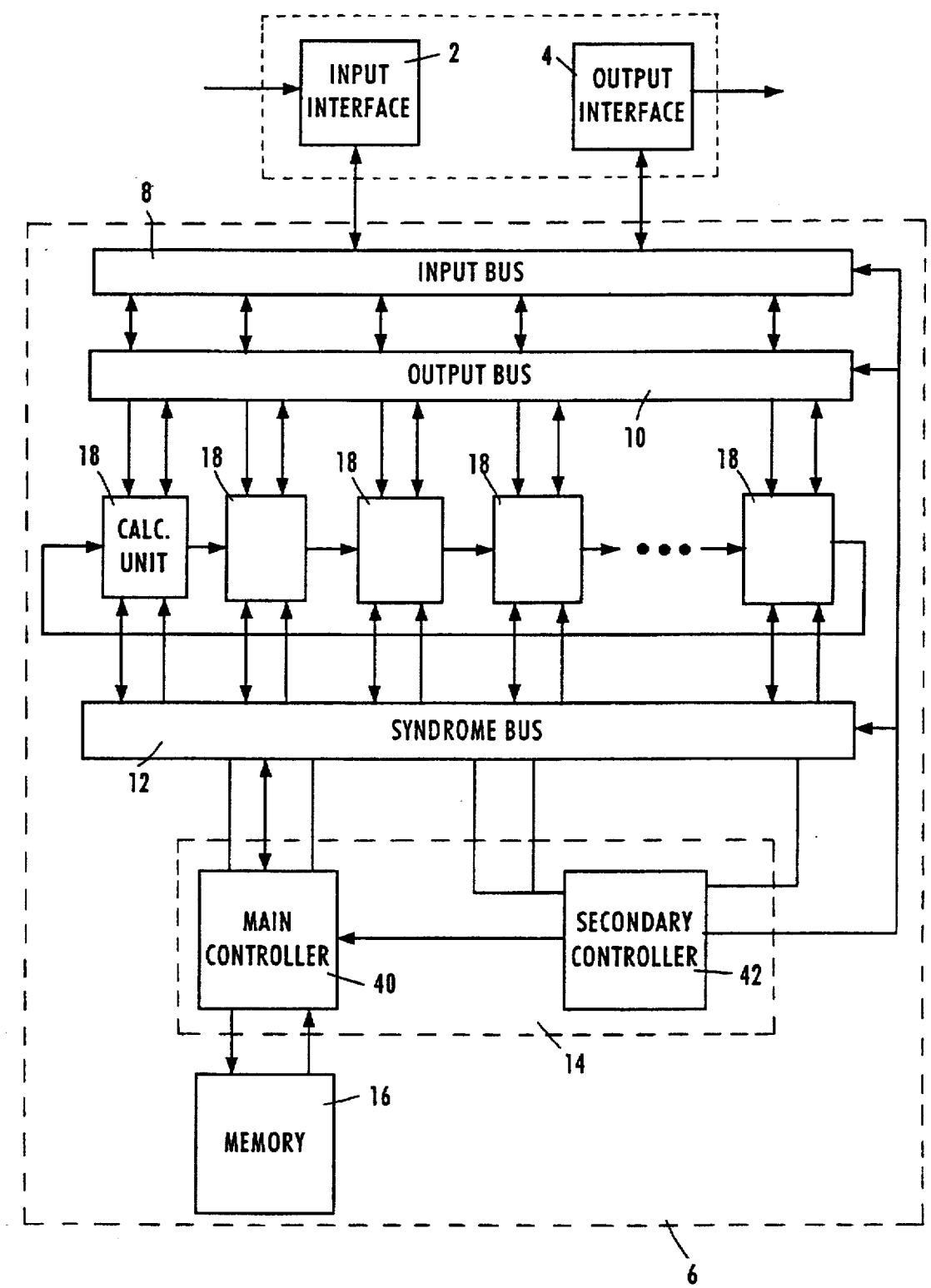
FIG. 2 is a block diagram of an apparatus in accordance with the present invention.
Figure 3:
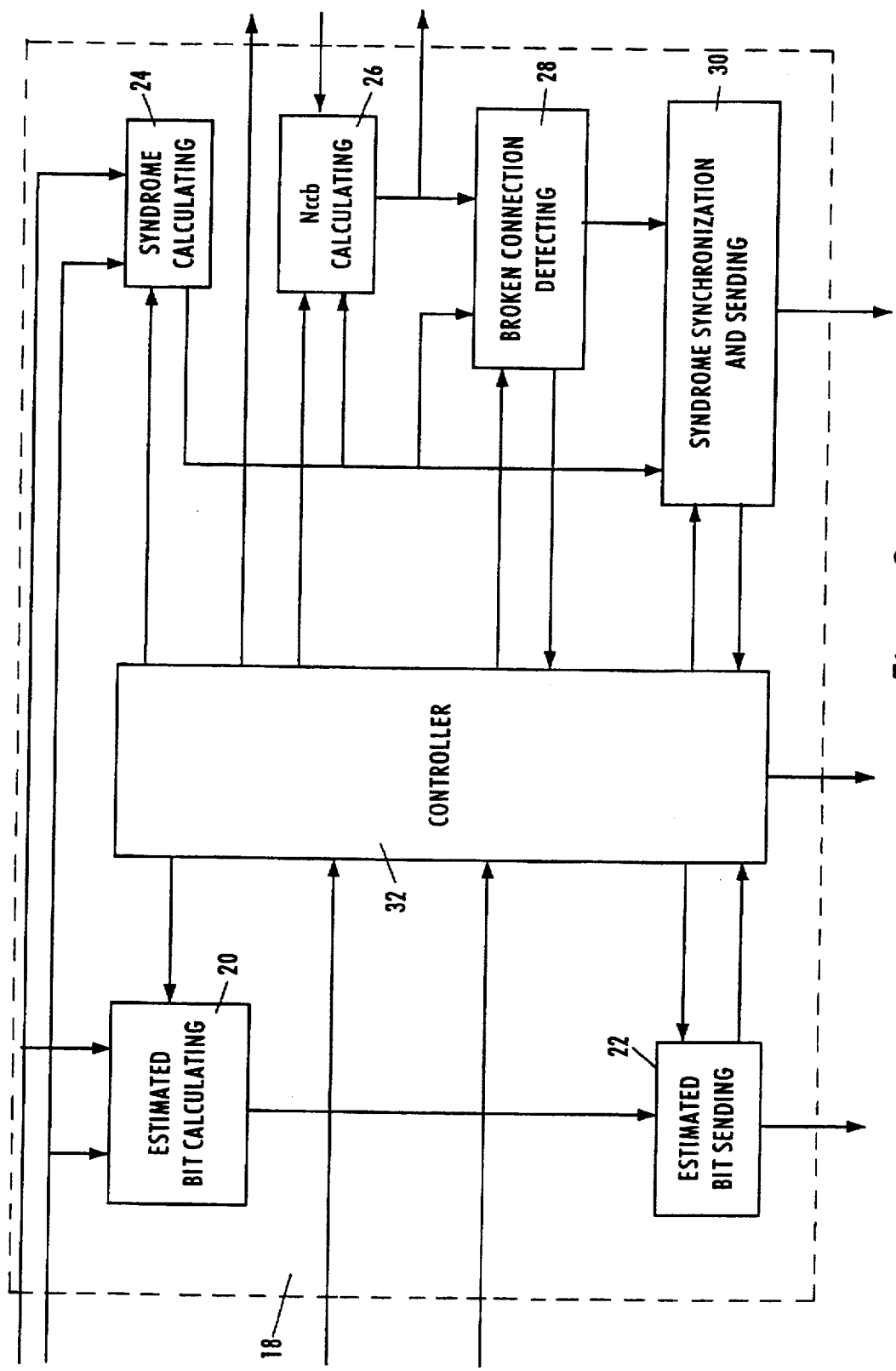
FIG. 3 is a block diagram showing with more details a block shown in FIG. 2.

Referring now to FIGS. 2 and 3, there is shown an apparatus for correcting and decoding a sequence of branches representing encoded data bits into estimated information bits. The encoded data bits were previously encoded in a convolutional manner.

The apparatus comprises setting means for setting accumulation, correction and event indicators respectively into non-accumulating, non-active and incomplete states, and setting a precedent Nccb variable at a predetermined value N. An input interface 2 is provided for receiving the sequence of branches.

First calculating means are provided for calculating (v−1) syndromes for each branch. Second calculating means are also provided for calculating an estimated information bit for each branch.

Storing means are provided for storing the estimated information bit for each branch, and third calculating means are provided for calculating for each branch an actual Nccb variable based on the (v−1) syndromes and on the precedent Nccb variable. First verifying and setting means are provided for verifying for each branch whether values of the precedent and actual Nccb variables are non-successive and whether the precedent Nccb variable is greater than or equal to N, and, if both conditions are positive, setting the accumulation indicator into an accumulating state and setting an Nss variable at zero.

Verifying, accumulating and incrementing means are also provided for verifying for each branch whether the accumulation indicator is in the accumulating state and whether the event indicator is in the incomplete state, and, if both conditions are positive, accumulating the (v−1) syndromes calculated by the first calculating means in a first register and incrementing the Nss variable by one. Verifying and storing means are also provided for verifying for each branch whether the correction indicator is in an active state and whether the event indicator is in the incomplete state, and, if both conditions are positive, storing the (v−1) syndromes calculated by the first calculating means in a second register. The second register has a given length.

First verifying, setting and transferring means are provided for verifying for each branch whether the accumulation indicator is in the accumulating state, whether the precedent Nccb variable equals (N−1) and whether the actual Nccb variable equals N, and, if all conditions are positive:

setting the accumulation indicator into the non-accumulating state, the correction indicator into an active state and the event indicator into a complete state;

transferring all of the syndromes accumulated in the first register in the second register; and setting an Nmp variable at a value of the Nss variable.

Second verifying and setting means are also provided for verifying for each branch whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second register.

Second verifying, setting and transferring means are provided for verifying for each branch whether the accumulation indicator is in the accumulating state, whether the event indicator is in the incomplete state and whether the first register is full, and, if all conditions are positive:

setting the accumulation indicator in the non-accumulating state and the correction indicator in the active state;

transferring all of the syndromes accumulated in the first register to the second register; and setting the Nmp variable at a value representing the length of the second register.

Verifying, correcting, updating, decrementing and setting means are also provided for verifying for each branch whether the correction indicator is in the active state, and if the correction indicator is in the active state:

correcting the estimated information bits convolutionally associated with the branch corresponding to the syndromes stored in the second register;

updating the syndromes stored in the second register;

verifying whether the event indicator is in the complete state and decrementing the Nmp variable by one if the event indicator is in the complete state; and verifying whether the Nmp variable equals zero and setting the event indicator into the incomplete state and the correction indicator into the non-active state if the Nmp variable equals zero.

An output interface 4 is provided for delivering an information bit. Verifying means are also provided for verifying whether the branch corresponding to the oldest undelivered estimated information bit has gone through all of the verifying means, and if the branch corresponding to the oldest undelivered estimated information bit has gone through all of the verifying means, delivering via the output interface the oldest undelivered estimated information bit when the oldest undelivered estimated information bit is no longer convolutionally associated with any of the branches corresponding to the syndromes stored in the first and second registers.

The input and output interfaces 2 and 4 are buffers. All of the means are embodied by a controller system 6 comprising an input bus 8 connected to the input interface 2, an output bus 10 connected to the output interface 4, a syndrome bus 12, a controller 14 connected to the syndrome, input and output buses 12, 8 and 10, a memory 16 connected to the controller 14, and calculating units 18 for calculating the (v−1) syndromes, estimated information bits and Nccb values. The units 18 are connected to the syndrome, input and output bus 12, 8 and 10. The controller 14 comprises main and secondary controllers 40 and 42 which are respectively provided with appropriate logic to perform the above described method.

Referring more specifically to FIG. 3, there is illustrated with more details one of the calculating units 18 shown in FIG. 2. Each calculating unit 18 comprises a controller 32 onto which are connected an Estimated Bit Calculating Module 20, an Estimated Bit Sending Module 22, a Syndrome Calculating Module 24, an Nccb Calculating Module 26, a Broken Connection Detecting Module 28 and a Syndrome Synchronisation and Sending Module 30. The controller 32 is provided with the appropriate logic to perform the above described method. The modules 20, 22, 24, 26, 28 and 30 of the calculating unit 18 are made of hardware elements but the functions performed by these modules and other modules as well can be performed by a software.

The corrections are thus based on masks that materialize new decoding hypotheses in the decoding process. The mask to select for a given received symbol is obtained by determining a syndrome sequence from this and neighboring received symbols. Syndromes allow the classification of error patterns into disjoint classes. Determining a given syndrome sequence for a received sequence therefore means that an error pattern belonging to the identified class occurred on the channel. However, because there is a multiplicity of error patterns in each class, a selection of the best mask pair must be performed beforehand.

The mask selection process is carried out with the objective of minimizing residual information bit errors. This means selecting for each class the mask pair that is part of the error pattern with minimum Hamming weight. If there are several patterns with minimum Hamming weight, the mask pair that is more frequently encountered in the class is selected. The list of mask pairs selected is stored in a table, accessible by syndrome values. Whenever a correction must be performed, the table is accessed using the syndrome sequence derived from the received symbols as an address.

Figure 1C:
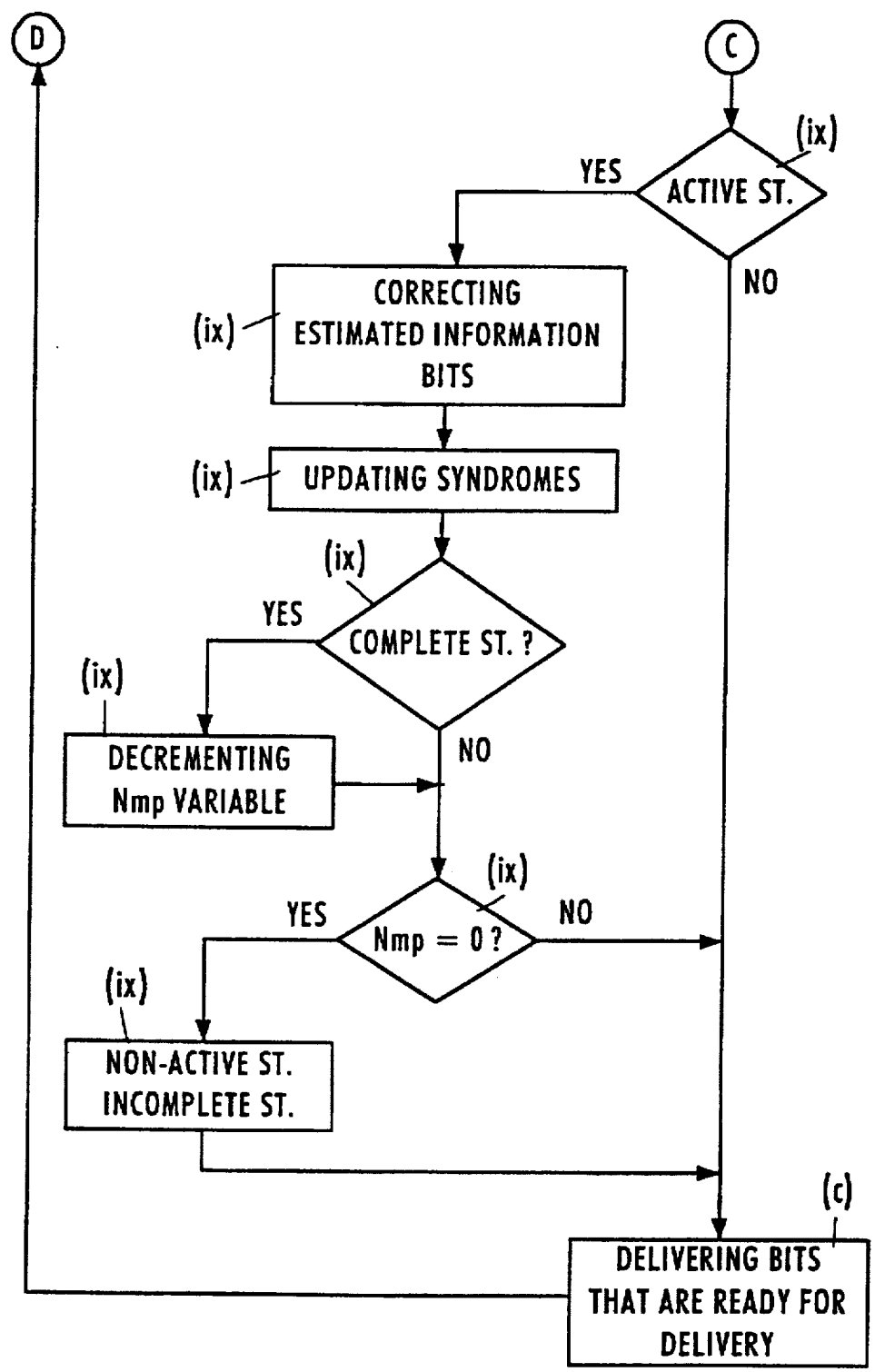
Figure 4:
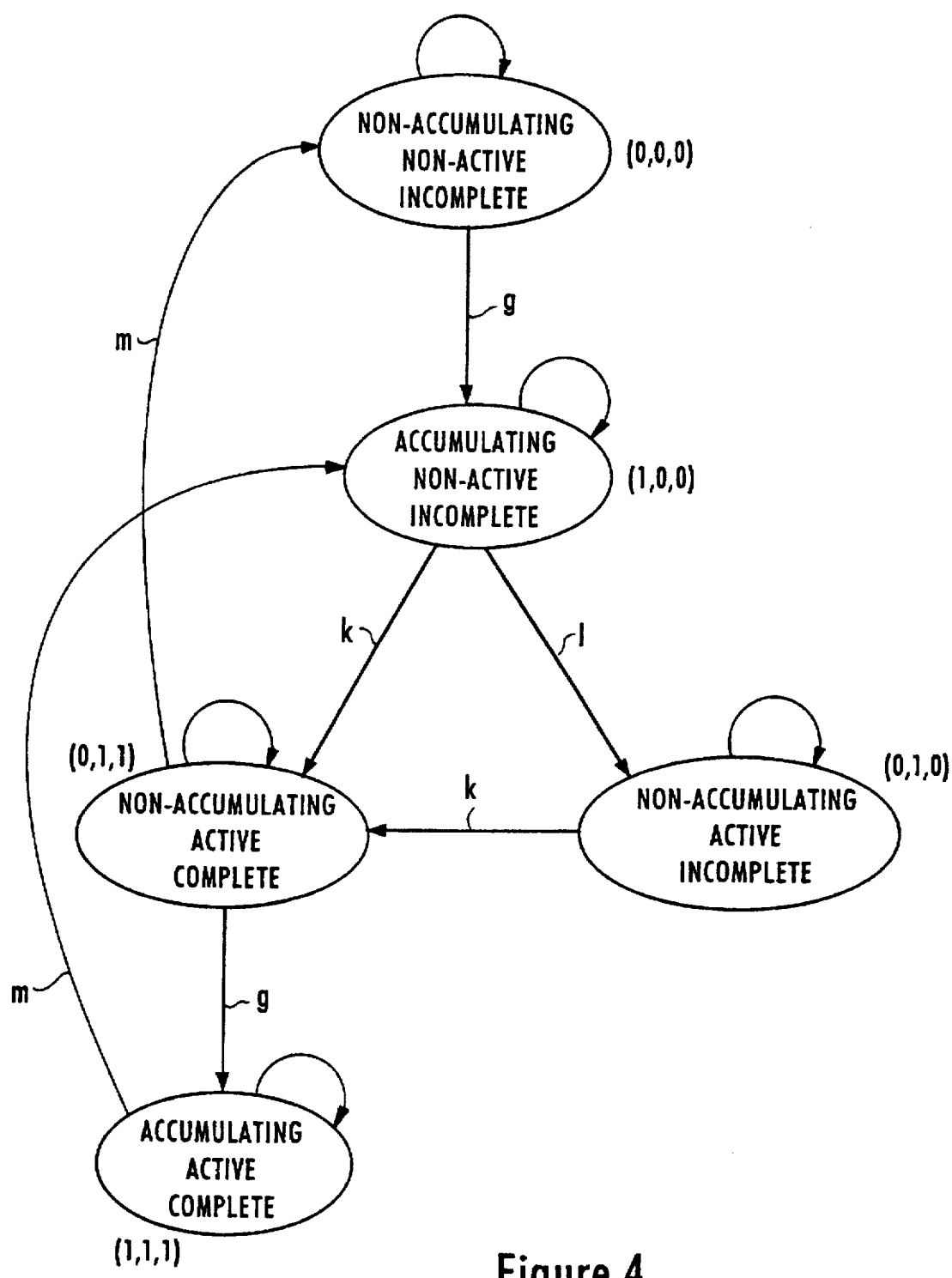
FIG. 4 is a state diagram of the operator mode of the apparatus shown on FIG. 2.

Referring now to FIG. 4, there is shown a state diagram corresponding to FIGS. 1A, 1B and 1C. As can be seen from this state diagram, five different states are possible. Beside each state, an identification in the form (I1, I2, I3) represent the state of the three indicators, which are respectively accumulation, correction and event. A zero value for the accumulation indicator corresponds to non-accumulating state, a zero value for the correction indicator corresponds to non-active state and a zero value for the event indicator corresponds to an incomplete state. For passing from one state to another, four different events are possible and are represented by the following letters:

m: no more masks to be provided;
    q: detection of broken connections;
    l: syndrome register full; and
    k: identification of connection.

Referring now to FIGS. 5A to 5E, there is shown how the different states interact according to the block diagrams of FIG. 1A to 1C. Thus, when there are no errors to correct, shown on FIG. 5A, the apparatus and method stay in the state non-accumulating, non-active and incomplete. Of course, highest speeds of processing are attained.

Figure 5A:
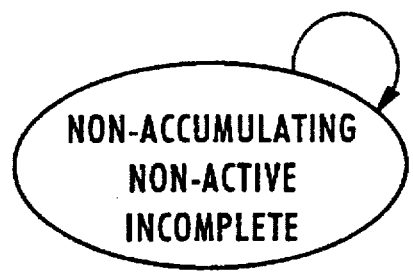
FIG. 5A, 5B, 5C, 5D and 5E are state diagrams showing states encountered for various error patterns.
Figure 5B:
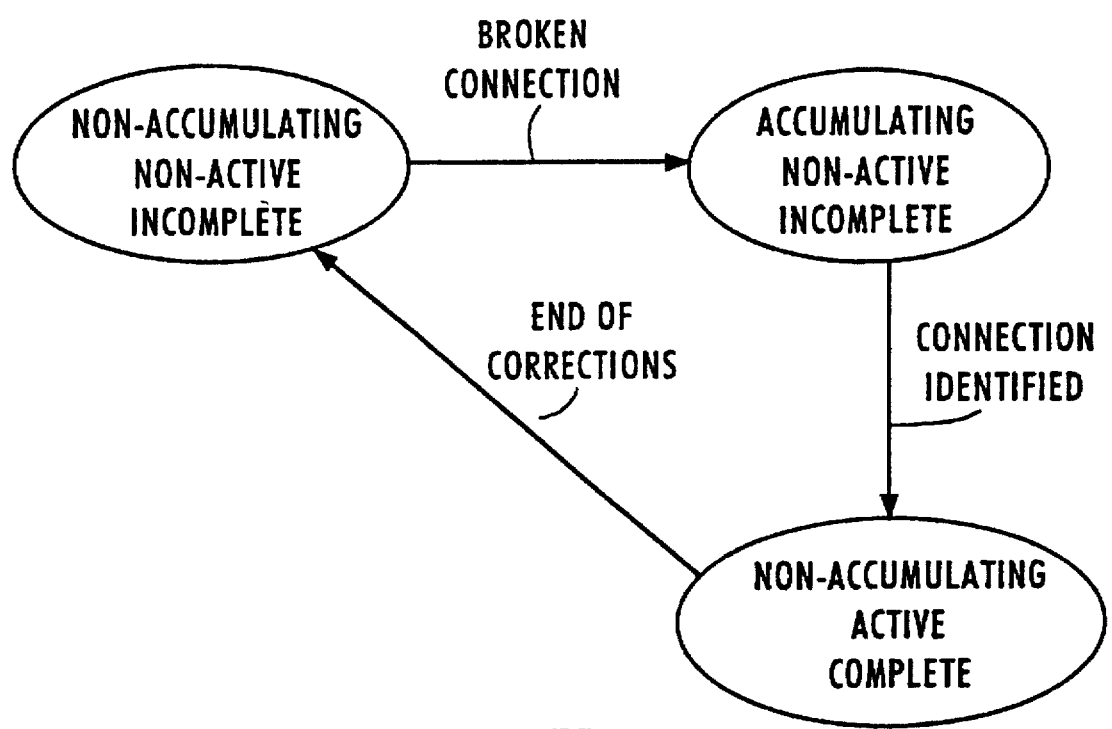

Referring now to FIG. 5B, there is shown the different states entered when there is a single short error. Then, when a broken connection is detected, the accumulating, non-active and incomplete state is entered and kept as long as the connection is identified, which changes the state into non-accumulating, active and complete state. From that state, when the corrections are finished, the non-accumulating, non-active and incomplete state is reentered.

Figure 5C:
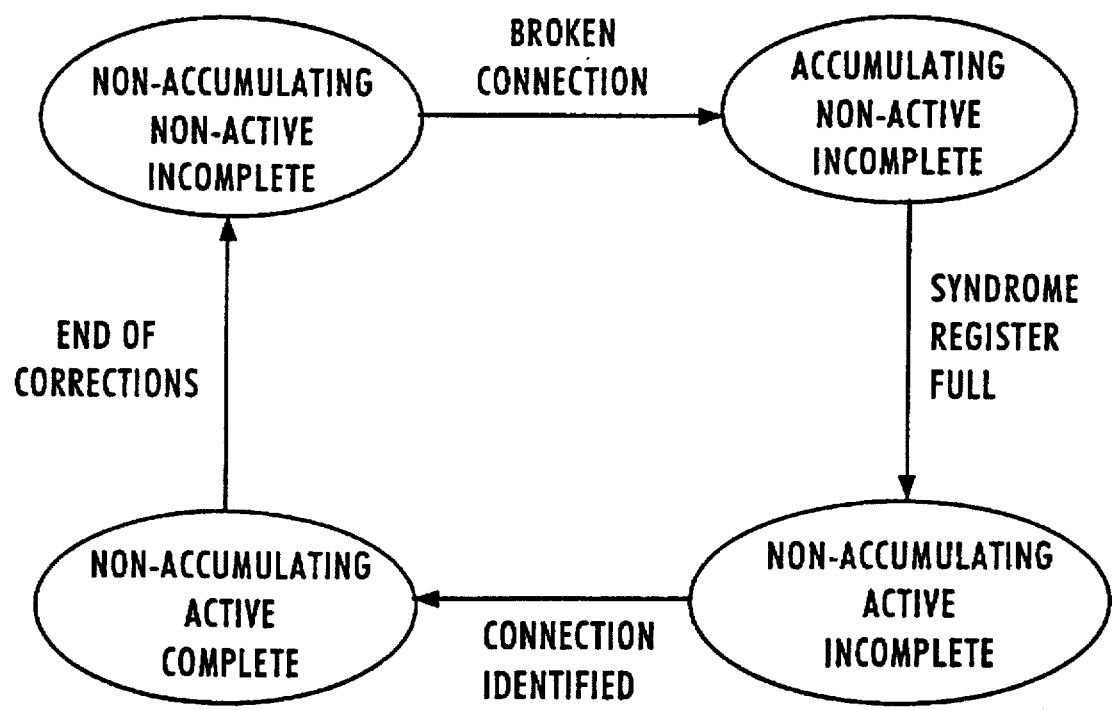

Referring now to FIG. 5C, there is shown the different states entered in the event of a single long error. As for the single short error of FIG. 5B, the initial state changes when a broken connection is identified. Then the accumulating, non-active and incomplete state is entered. Since a long error is involved, the syndrome register will be full before the connection can be identified, which causes entry into the non-accumulating, active and incomplete state. Then, when the connection will be identified, the non-accumulating-active and complete state is entered and the next state is the same as in FIG. 5B.

Figure 5D:
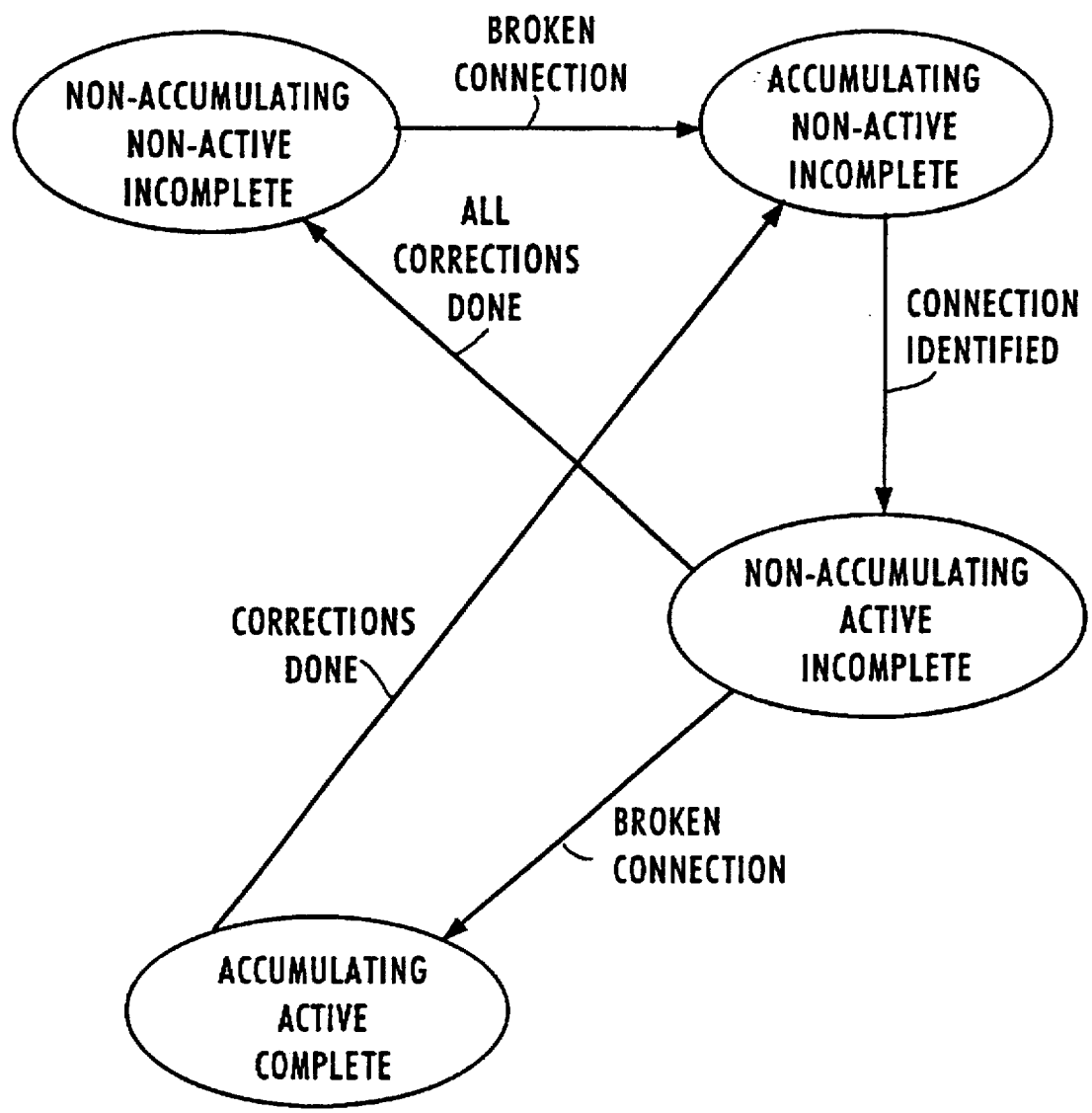

Referring now to FIG. 5D, there is shown the different states possible widen there are adjacent short errors. The three states of FIG. 5B and its connection are present, and to these states are added two more connections and one more state, the accumulating, active and complete state. The difference with the state diagram of FIG. 5B resides in that when in the non-accumulating, active and complete state, a second broken connection is detected. Then, the accumulating, active and complete state is entered, and when the corrections will be done on the first broken connection, the accumulating, non-active and incomplete state will be reentered, for the second broken connection detected.

Figure 5E:
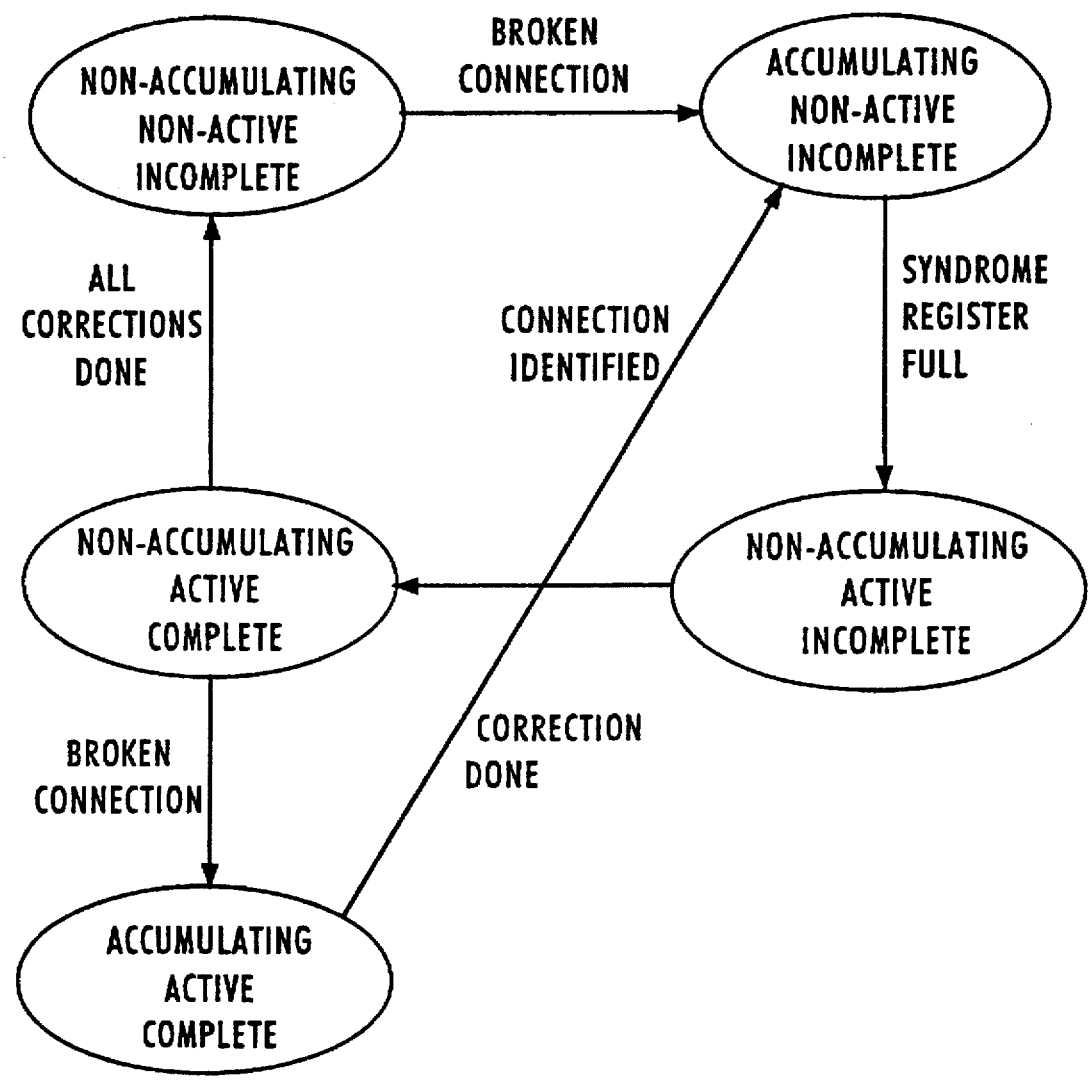

Referring now to FIG. 5E, there is shown the states entered when a long error event is followed by a short error event. This state diagram takes back the states and connections of FIG. 5C, with an accumulation, active and complete state added. Thus, when a broken connection is identified when in non-accumulating, active and complete state, the accumulating, active and complete state is entered, and when all the correction will be done to the first broken connection identified, the accumulating, non-active and incomplete state will be reentered.

The tables of FIGS. 6A to 6C illustrate the mask selection process used for generating the table. The table of FIG. 6A shows a few of the error patterns considered in generating the mask table, and corresponding syndrome bits. For illustration purposes, a syndrome register holding 6 syndrome bits is assumed, so a table of $2^6$ entries is to be constructed. In practice, larger tables would be generated. In order to choose most likely error patterns, the patterns are generated by increasing Hamming weight. In the table of FIG. 6A for instance, all the weight 1 patterns and some weight 2 patterns are illustrated.

The table is constructed by selecting for each syndrome bit pattern observed, the mask pair that corresponds to the least weighing error pattern. In the table of FIG. 6B, all the error patterns yielding syndrome bits 000010 have been collected. There are six weight-3 error patterns and one weight-2 error pattern, hence the mask pair corresponding to the first pair of the weight-2 pattern is selected and will appear in the table at address 000010.

The choice is not always so obvious. Consider for instance the table of FIG. 6C where all the error patterns yielding syndrome bits 011101 have been collected. All the error patterns have weight-3, so closer examination of the error patterns is needed. The table of FIG. 6C reveals that three patterns have a 00 first pair, one has a 01 first pair and one has a 10 first pair, so a mask pair of 00 will be selected.

One of the main advantages of the proposed architecture is its great flexibility. Indeed, it can be easily upgraded to more powerful correcting codes, just by adding some (unchanged) processors and by adjusting the controller. As far as hardware is concerned, most parts of the decoder are made code independent. Moreover, the decoder parts that are not strictly code independent may be designed programmable enough to work with several different codes. Also, the decoder may be implemented in such a way that different table sizes are easily accommodated. Since the quality of decoding depends on the size of the look-up tables, an easy way to upgrade the decoder's performance is to increase the size of these tables, which can be done by simply adding memory chips.

Another important aspect of the performance of the decoder is the speed at which it can process data. With the proposed decoding method, this speed is variable since in the non-accumulating non-active incomplete state, the decoder merely extends an appropriate path which is one of those shown in FIGS. 5B, 5C, 5D and 5E. Those paths involve syndrome computations, table look-ups, corrections, etc. which understandly take more time. In fact, it is the access time to the mask tables which should limit the overall speed of the decoder. However, table accesses are rather infrequent since most of the times the received symbols are exempt from noise corruptions.

The system may be designed with buffered table access so that the overall decoding speed is faster than would be possible if the tables were to be accessed at every decoding step. This approach introduces delays in the decoding decisions, but the increased speed obtained in return is certainly a desirable feature. If the delays exceed an acceptable level, decoding decisions may be forced, with potential degradations in the quality of decoding. Trade-offs between decoding speed and quality of decor . . are thus possible.

With or without buffered table acc . the decoder will operate faster in low noise conditions and, accordingly, slower in more noisy situations. This variable behavior may be exploited by tailoring decoder specifications to the application and by exploiting further trade-offs between speed, quality of decoding and cost.

Although the present invention has been explained hereinafter by way of preferred embodiments thereof, it should be pointed out that any modifications to these preferred embodiments, within the scope of the appended claims is not deemed to alter or change the nature in scope of the present invention.

We claim:
1. A method for correcting and decoding a sequence of branches representing encoded data bits into estimated information bits, the encoded data bits having been previously encoded in a convolutional manner with v encoded symbols forming a branch where v is a predetermined value, the method comprising the steps of:
   a) setting accumulation, correction and event indicators respectively into non-accumulating, non-active and incomplete states, and setting a precedent Nccb variable at a predetermined value N;
   b) receiving the sequence of branches, for each of the branches received in the step (b):
      i) calculating (v−1) syndromes corresponding to the branch;
      ii) calculating an estimated information bit, storing the estimated information bit and calculating an actual Nccb variable based on the (v−1) syndromes and on the precedent Nccb variable;
      iii) verifying whether values of the precedent and actual Nccb variables are non-successive and whether the precedent Nccb variable is greater than or equal to N, and, if both conditions are positive, setting the accumulation indicator into an accumulating state and setting an Nss variable at zero;
      iv) verifying whether the accumulation indicator is in the accumulating state and whether the event indicator is in the incomplete state, and, if both conditions are positive, accumulating the (v−1) syndromes calculated in step (i) in a first register and incrementing the Nss variable by one;
      v) verifying whether the correction indicator is in an active state and whether the event indicator is in the incomplete state, and, if both conditions are positive, storing the (v−1) syndromes calculated in step (i) in a second register having a given length;
      vi) verifying whether the accumulation indicator is in the accumulating state, whether the precedent Nccb variable equals (N−1) and whether the actual Nccb variable equals N, and, if all conditions are positive:
         setting the accumulation indicator into the non-accumulating state, the correction indicator into an active state and the event indicator into a complete state;
         transferring all of the syndromes accumulated in the first register in the second register; and
         setting an Nmp variable at a value of the Nss variable;
      vii) verifying whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second register;
      viii) verifying whether the accumulation indicator is in the accumulating state, whether the event indicator is in the incomplete state and whether the first register is full, and, if all conditions are positive:
         setting the accumulation indicator in the non-accumulating state and the correction indicator in the active state;
         transferring all of the syndromes accumulated in the first register to the second register; and
         setting the Nmp variable at a value representing the length of the second register;
      ix) verifying whether the correction indicator is in the active state, and if the correction indicator is in the active state:
         correcting estimated information bits convolutionally associated with the branch corresponding to the syndromes stored in the second register;
         updating the syndromes stored in the second register;
         verifying whether the event indicator is in the complete state and decrementing the Nmp variable by one if the event indicator is in the complete state; and
         verifying whether the Nmp variable equals zero and setting the event indicator into the incomplete state and the correction indicator into the non-active state if the Nmp variable equals zero; and
   c) verifying whether the branch corresponding to the oldest undelivered estimated information bit has gone through steps (i) to (ix), and if the branch corresponding to the oldest undelivered estimated information bit has gone through steps (i) to (ix), delivering the oldest undelivered estimated information bit when said oldest undelivered estimated information bit is no longer convolutionally associated with any of the branches corresponding to the syndromes stored in the first and second registers.

2. The method of claim 1, wherein:
   the step (a) further comprises the step of setting a variable Nb equal to 0;
   the step (i) further comprises the step of incrementing the variable Nb by 1; and
   in step (c), the oldest undelivered estimated bit is the estimated bit having a position corresponding to a value of (Nb−Dd), Dd having a value suitably selected to allow that the oldest undelivered estimated information bit be no longer convolutionally associated with any of the branches corresponding to the syndromes stored in the first and second registers.

3. The method of claim 2, wherein:
   the step (a) further comprises the step of providing a masking table; and
   the correcting of the step (ix) comprises the steps of:
      using the masking table to determine a mask corresponding to the syndromes stored in the second register;
      applying a correction factor to the estimated information bit convolutionally associated with all of the branches corresponding to the syndromes stored in the second register to perform a correction thereof, the correction factor being determined from the mask and from the convolutional manner; and
      applying an updating factor to the syndromes stored in the second register, the updating factor being determined from the mask and from the convolutional manner.

4. The method of claim 2, wherein the step (ii) comprises, before the steps of calculating an estimated information bit and storing the estimated information bit of the step (ii), the step of verifying whether Nb is greater than a predetermined value Nmin and, if the Nb is greater than the predetermined value Nmin, then performing the steps of calculating an estimated information bit and storing the estimated information bit of the step (ii).

5. The method of claim 4, where the encoded data bits have been previously encoded in a convolutional manner with v encoded symbols forming a branch, v being a predetermined value, and with a constraint span K, wherein:

in the step (ii), the predetermined value Nmin is equal to (K−2).

6. The method of claim 1, wherein:

the step (c) further comprises the step of verifying whether the oldest undelivered estimated information bit is no longer convolutionally associated with any of the branches corresponding to the syndromes stored in the first and second registers and if the oldest undelivered estimated information bit is no longer convolutionally associated with any of the branches corresponding to the syndromes stored in the first and second registers, delivering the oldest undelivered estimated information bit.

7. The method of claim 6, wherein:

the step (a) further comprises the step of providing a masking table;

the correcting of the step (ix) comprises the steps of:
using the masking table to determine a mask corresponding to the syndromes stored in the second register;
applying a correction factor to the estimated information bit convolutionally associated with all of the branches corresponding to the syndromes stored in the second register to perform a correction thereof, the correction factor being determined from the mask and from the convolutional manner; and
applying an updating factor to the syndromes stored in the second register, the updating factor being determined from the mask and from the convolutional manner.

8. The method of claim 6, wherein the step (ii) comprises, before the steps of calculating an estimated information bit and storing the estimated information bit of the step (ii), the step of verifying whether all the branches convolutionally associated with the estimated information bit to be calculated are received and, if all the branches convolutionally associated with the estimated information bit to be calculated are received, performing the steps of calculating an estimated information bit and storing the estimated information bit of the step (ii).

9. The method of claim 1, wherein:

the step (a) further comprises the step of providing a masking table; and the correcting of the step (ix) comprises the steps of:
using the masking table to determine a mask corresponding to the syndromes stored in the second register;
applying a correction factor to the estimated information bit convolutionally associated with all of the branches corresponding to the syndromes stored in the second register to perform a correction thereof, the correction factor being determined from the mask and from the convolutional manner; and
applying an updating factor to the syndromes stored in the second register, the updating factor being determined from the mask and from the convolutional manner.

10. An apparatus for correcting and decoding a sequence of branches representing encoded data bits into estimated information bits, the encoded data bits having been previously encoded in a convolutional manner, the apparatus comprising:

setting means for setting accumulation, correction and event indicators respectively into non-accumulating, non-active and incomplete states, and setting a precedent Nccb variable at a predetermined value N;

an input interface for receiving the sequence of branches;

first calculating means for calculating (v−1) syndromes for each branch;

second calculating means for calculating an estimated information bit for each branch;

storing means for storing the estimated information bit for each branch;

third calculating means for calculating for each branch an actual Nccb variable based on the (v−1) syndromes and on the precedent Nccb variable;

first verifying and setting means for verifying for each branch whether values of the precedent and actual Nccb variables are non-successive and whether the precedent Nccb variable is greater than or equal to N, and, if both conditions are positive, setting the accumulation indicator into an accumulating state and setting an Nss variable at zero;

verifying, accumulating and incrementing means for verifying for each branch whether the accumulation indicator is in the accumulating state and whether the event indicator is in the incomplete state, and, if both conditions are positive, accumulating the (v−1) syndromes calculated by the first calculating means in a first register and incrementing the Nss variable by one;

verifying and storing means for verifying for each branch whether the correction indicator is in an active state and whether the event indicator is in the incomplete state, and, if both conditions are positive, storing the (v−1) syndromes calculated by the first calculating means in a second register having a given length;

first verifying, setting and transferring means for verifying for each branch whether the accumulation indicator is in the accumulating state, whether the precedent Nccb variable equals (N−1) and whether the actual Nccb variable equals N, and, if all conditions are positive:
setting the accumulation indicator into the non-accumulating state, the correction indicator into an active state and the event indicator into a complete state; transferring all of the syndromes accumulated in the first register in the second register; and
setting an Nmp variable at a value of the Nss variable;

second verifying and setting means for verifying for each branch whether the value of the precedent Nccb variable equals (N−1), whether the value of the actual Nccb variable equals N, whether the accumulation indicator is in the non-accumulating state, whether the correction indicator is in the active state and whether the event indicator is in the incomplete state, and, if all conditions are positive, setting the event indicator into the complete state and setting the Nmp variable at a value representing the length of the second registers;

second verifying, setting and transferring means for verifying for each branch whether the accumulation indicator is in the accumulating state, whether the event indicator is in the incomplete state and whether the first register is full, and, if all conditions are positive:
setting the accumulation indicator in the non-accumulating state and the correction indicator in the active state;
transferring all of the syndromes accumulated in the first register to the second register; and
setting the Nmp variable at a value representing the length of the second register;

verifying, correcting, updating, decrementing and setting means for verifying for each branch whether the correction indicator is in the active state, and if the correction indicator is in the active state:

correcting the estimated information bits convolutionally associated with the branch corresponding to the syndromes stored in the second register;

updating the syndromes stored in the second register;

verifying whether the event indicator is in the complete state and decrementing the Nmp variable by one if the event indicator is in the complete state; and verifying whether the Nmp variable equals zero and setting the event indicator into the incomplete state and the correction indicator into the non-active state if the Nmp variable equals zero;

output interface for delivering an information bit; and verifying means for verifying whether the branch corresponding to the oldest undelivered estimated information bit has gone through all of the verifying means, and if the branch corresponding to the oldest undelivered estimated information bit has gone through all of the verifying means, delivering via the output interface the oldest undelivered estimated information bit when the oldest undelivered estimated information bit is no longer convolutionally associated with any of the branches corresponding to the syndromes stored in the first and second registers.

11. Apparatus according to claim 10, wherein the input and output interfaces are buffers.

12. Apparatus according to claim 10, wherein all of the means are embodied by a controller system comprising:

an input bus connected to the input interface;

an output bus connected to the output interface;

a syndrome bus;

a controller connected to the syndrome, input and output bus;

a memory connected to the controller;

calculating units for calculating the (v−1) syndromes, estimated information bits and Nccb values, the units being connected to the syndrome, input and output bus.

* * * * *